United States Patent
Unno et al.

(10) Patent No.: US 6,841,490 B2
(45) Date of Patent: Jan. 11, 2005

(54) SEMICONDUCTOR SUBSTRATE, SOI SUBSTRATE AND MANUFACTURING METHOD THEREFOR

(75) Inventors: Akira Unno, Kanagawa-ken (JP); Takao Yonehara, Kanagawa-ken (JP); Tetsuro Fukui, Kanagawa-ken (JP); Takanori Matsuda, Kanagawa-ken (JP); Kiyotaka Wasa, Nara-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/694,053

(22) Filed: Oct. 28, 2003

(65) Prior Publication Data

US 2004/0077153 A1 Apr. 22, 2004

Related U.S. Application Data

(62) Division of application No. 10/068,988, filed on Feb. 11, 2002, now Pat. No. 6,653,211.

(30) Foreign Application Priority Data

Feb. 9, 2001 (JP) ........................................ 2001-033808

(51) Int. Cl.[7] ...................... H01L 21/283; H01L 21/31; H01L 21/469
(52) U.S. Cl. ...................... 438/761; 438/763; 438/765; 438/769
(58) Field of Search .................. 438/287, 761–786; 257/213, 288, 310, 410

(56) References Cited

U.S. PATENT DOCUMENTS

| | | | | |
|---|---|---|---|---|
| 4,857,485 A | * | 8/1989 | Brennan et al. ................ 501/7 |
| 5,120,707 A | * | 6/1992 | Maxfield et al. ............ 505/325 |
| 5,252,543 A | * | 10/1993 | Tanaka et al. .............. 505/232 |
| 5,358,925 A | | 10/1994 | Neville Connell et al. . 505/235 |
| 5,366,953 A | | 11/1994 | Char et al. ................... 505/329 |
| 5,443,030 A | * | 8/1995 | Ishihara et al. ................ 117/8 |
| 5,582,640 A | | 12/1996 | Okada et al. ................... 117/8 |
| 5,589,407 A | * | 12/1996 | Meyyappan et al. ........ 438/766 |
| 5,793,057 A | * | 8/1998 | Summerfelt ................. 257/55 |
| 5,828,080 A | | 10/1998 | Yano et al. ................... 257/43 |
| 5,846,505 A | * | 12/1998 | Saegusa ....................... 423/263 |
| 6,013,553 A | * | 1/2000 | Wallace et al. ............. 438/287 |
| 6,045,626 A | | 4/2000 | Yano et al. ................. 148/33.4 |
| 6,093,243 A | | 7/2000 | Okada et al. ................... 117/8 |
| 6,103,009 A | * | 8/2000 | Atoji ............................ 117/97 |
| 6,121,117 A | * | 9/2000 | Sato et al. .................... 438/459 |
| 6,190,963 B1 | * | 2/2001 | Zhang et al. ............... 438/254 |
| 6,224,668 B1 | * | 5/2001 | Tamatsuka .................... 117/84 |
| 6,232,242 B1 | | 5/2001 | Hata et al. .................. 438/762 |
| 6,454,964 B1 | * | 9/2002 | Scott et al. ............ 252/182.12 |
| 6,472,276 B1 | * | 10/2002 | Hilt et al. ................... 438/285 |
| 6,573,209 B1 | * | 6/2003 | Sambasivan et al. ...... 501/96.1 |
| 6,590,236 B1 | * | 7/2003 | El-Zein et al. ............. 257/201 |
| 6,613,658 B2 | * | 9/2003 | Koyama et al. ............ 438/591 |
| 6,645,639 B1 | * | 11/2003 | Sambasivan et al. ....... 428/469 |
| 6,653,211 B2 | * | 11/2003 | Unno et al. ................. 438/479 |

FOREIGN PATENT DOCUMENTS

| | | |
|---|---|---|
| JP | 7-150361 A | 6/1995 |
| JP | 10-265948 A | 10/1998 |

* cited by examiner

*Primary Examiner*—Michael Lebentritt
(74) *Attorney, Agent, or Firm*—Fitzpatrick, Cella, Harper & Scinto

(57) ABSTRACT

A substrate for a semiconductor device includes a crystalline silicon substrate; an insulative silicon compound layer thereon and a crystalline insulation layer on the insulative silicon compound layer, wherein the insulative silicon compound layer contains not more than 10 at % of component element of a material constituting the crystalline insulation layer, the component element being provided in the insulative silicon compound layer by diffusion.

4 Claims, 3 Drawing Sheets

(a)

(b)

(a)

(b)

SEMICONDUCTOR SUBSTRATE, SOI SUBSTRATE AND MANUFACTURING METHOD THEREFOR

This application is a division of application Ser. No. 10/068,988, filed Feb. 11, 2002, now U.S. Pat. No. 6,653,211.

FIELD OF THE INVENTION AND RELATED ART

The present invention relates to a substrate for a semiconductor apparatus, such as a SOI substrate or FET having a MFS structure (metal-film/ferroelectric-material-film/semiconductor layer structure), in which a crystalline insulation layer is provided on a silicon substrate with an insulation layer exhibiting an electrical insulation property or a micro machining property interposed therebetween such that semiconductor crystal layer or a ferroelectric crystal layer can be grown, and a manufacturing method therefor. The substrate for the semiconductor device in this invention includes a substrate which can be a complete base for a semiconductor device and a base on which crystalline semiconductor layer and a dielectric layer, the substrate partly having an insulative silicon compound layer or a crystalline insulation layer as will be described hereinafter, a substrate to be provided on a laminated semiconductor layer, and a substrate for micro machining having a crystalline insulation layer with an insulation layer to improve a micro machining property. Particularly, the substrate for the micro machine is used when machining is effected on top or bottom of the substrate to permit repetitive fine mechanical deformation or vibration. An example of the substrate for micro machining comprises a silicon vibrational plate and a monocrystal PZT film formed thereon, wherein a liquid chamber is formed by etching a bottom side (unimorph structure), or a cantilever structure for reflecting light.

As for a SOI substrate with which a semiconductor crystal layer is formed on an insulation layer, for example, there are known a method in which two silicon substrates 2 having oxide films formed thereon are pasted to each other, and one of the substrates are removed by abrasion or etching so that thin semiconductor layer remains, or oxygen or the like is injected to a predetermined depth by ion injection from the surface of the silicon substrate, and then an annealing process is carried out, so that insulation layer is implanted into the semiconductor substrate. On the other hand, in a semiconductor memory device using a ferroelectric material layer, a ferroelectric material layer is laminated on a semiconductor layer, with or without an insulation film therebetween, or on a surface of an electrode metal such as platinum or the like. In the case of a MFS structure in which a ferroelectric material layer is laminated on a semiconductor layer, an oxide film is produced between the ferroelectric material layer and the semiconductor layer with the result of deterioration of the crystallinity or mofology and increase of interface level density between the ferroelectric material layer and the semiconductor layer. Even if a ferroelectric material layer is laminated on an insulation film, it is not possible to grow a ferroelectric material layer having a sufficient crystallinity on an amorphous insulation film. With a method in which metal is oxidized, and simultaneously the silicon is also oxidized, a high quality insulation layer is not provided, and in addition, the crystal insulation layer thereon does not exhibit a sufficient orientation. In a manufacturing process for a semiconductor device, there is a case in which epitaxial growth of a semiconductor layer, a crystalline dielectric layer or the like is required on a semiconductor substrate with an insulation layer therebetween, but it is not possible to directly laminate a layer having a high crystallinity on the surface of an insulation layer. Recently, however, using said pasting method, a SOI method has been put into practice in which one of the silicon layer is thinned by abrasion, etching or water knife, but with this method, a very expensive process is required, so that substrate per se is expensive. For a structure for micro machine or the like, an inexpensive substrate and manufacturing method therefor are desired. In a method in which oxygen or the like is implanted in the surface layer portion of the semiconductor substrate, the deterioration of the surface of the semiconductor layer by the ion implanting is significant, and the ion injection is again expensive, and therefore, the same problems are involved. As for a method in which epitaxial growth of YSZ thin film is effected on a silicon substrate, there is method disclosed in SHINGAKU GIHOU (ED96-42, CPM96-27, May, 1996) or a method disclosed in Japanese Laid-open Patent Application Hei 07-150361. According to these methods, an insulation layer having a crystalline property can be provided on a silicon substrate, and a semiconductor layer or ferroelectric material layer can be formed on the surface through epitaxial growth. However, the YSZ thin film formed on the silicon substrate is a crystalline metal oxide involving ion movement, and therefore, electrical insulation and the etching stop property when used for micro machining, are poorer than the silicon oxide film or the silicon nitride film, with the result of slight deterioration of the performance. Japanese Laid-open Patent Application Hei 10-265948 discloses that amorphous silicon oxide film is formed on crystalline silicon, and a crystalline insulation layer is further formed. This method is equivalent to a technique of forming an amorphous silicon oxide layer and a crystalline insulation layer within oxygen ambience as disclosed in No.167 KENKYUKAISHIRYO (42–43) in a 131st thin film Committee of Japan GAKUJUTU SINKOU-KAI held in HAKUUNRO HOTEL, May 31–Jun. 1, 1993, and these methods involve a problem that resultant amorphous layer contains a large amount of impurity element because of introduction of oxygen during sputtering operation. Although the crystallinity of the produced crystalline insulation layer exhibits YSZ (111) matchable with silicon lattice matching, the orientation in the plane is not possible, so that no complete epitaxial layer can not be provided.

SUMMARY OF THE INVENTION

These and other objects, features and advantages of the present invention will become more apparent upon a consideration of the following description of the preferred embodiments of the present invention taken in conjunction with the accompanying drawings.

Accordingly, it is a principal object of the present invention to provide a substrate for a semiconductor device, SOI substrate and a manufacturing method capable of manufacturing such substrates with low cost, which is suitable for growth of a crystal layer such as a semiconductor layer, a ferroelectric material layer or the like on another semiconductor layer with an insulation layer therebetween in a semiconductor device manufacturing step, and an electrical insulation property relative to the silicon substrate which is the base, an etching stop property, or a repetitive vibration property for a micro actuator or the like, can be improved, with low cost.

According to an aspect of the present invention, there is provided a substrate for a semiconductor device comprising a crystalline silicon substrate; an insulative silicon compound layer thereon and a crystalline insulation layer on said insulative silicon compound layer, wherein said insulative silicon compound layer contains not more than 10 at % of component element of a material constituting said crystalline insulation layer, the component element being provided in said insulative silicon compound layer by diffusion.

According to another aspect of the present invention, there is provided a SOI substrate comprising said substrate for the semiconductor device as defined in the above paragraph, further comprising a crystalline silicon on said crystalline insulation layer.

According to a further aspect of the present invention, there is provided a manufacturing method for a semiconductor device substrate, comprising ejecting in non-active gas a metal oxide constituting a crystalline insulation layer; forming a crystal layer of a crystalline insulative material on a silicon substrate heated up to not lower than 400° C.; forming an insulative silicon compound layer on said silicon substrate by oxygen diffusion from an oxide during said crystal layer formation step, oxygen diffusion during a temperature holding time after said crystal layer formation step and/or oxygen diffusion during cooling operation.

According to a further aspect of the present invention, there is provided a method for manufacturing SOI substrate comprising a method as defined in the above paragraph, wherein crystalline silicon film is formed on the crystalline insulation layer which is formed on the silicon substrate.

According to the present invention, a structure is provided in which a crystalline insulation layer is formed on a silicon crystal layer with an amorphous insulation film of silicon compound exhibiting good insulation property and etching property, and therefore, another semiconductor layer or crystalline dielectric layer can be formed thereon by epitaxial growth, and a three-dimensional semiconductor device, a complex semiconductor device, a high performance semiconductor memory device can be formed. A new highly integrated semiconductor devices can be manufactured with low cost. In addition, an oxide layer exhibiting a good etching property can be provided, and therefore, by combination with a highly oriented PZT, a micro actuator having a good vibration property can be formed. A new micro device can be manufactured with low cost.

These and other objects, features and advantageous of the present invention will become more apparent upon a consideration of the following description of the preferred embodiments of the present invention taken in conjunction with the accompanying drawings.

DESCRIPTION OF THE PREFERRED EMBODIMENTS

The preferred embodiments of the present invention will be described in conjunction with the accompanying drawings.

Figure 1:
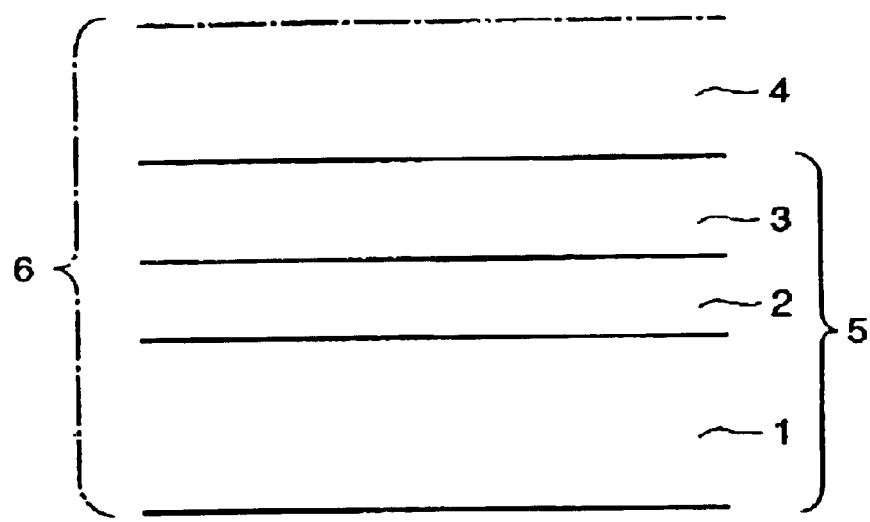
FIG. 1 illustrates a structure of a semiconductor device substrate according to an embodiment of the present invention.

As shown in FIG. 1, the substrate for the semiconductor device comprises a (crystalline) silicon substrate 1, a crystalline insulation layer 3 such as YSZ or the like, and an insulative silicon compound layer 2 such as silicon oxide film or the like which exhibits a high electrical insulation property and etching stop property.

The silicon substrate 1 comprises a silicon monocrystal layer of n-type, p-type or a type in which n-type region or p-type region is formed, and a semiconductor circuit is formed, or a type in which a silicon semiconductor layer is formed on another semiconductor layer or the like through epitaxial growth at its entire or partial surface.

The crystalline insulation layer (monocrystal insulation layer) 3 may be, for example, a metal oxide with which a crystalline structure can be formed, and it may be YSZ (yttria-stabilized zirconia), $Al_2O_3$ (sapphire), $CeO_2$ (ceria), MgO (magnesia), $SrTiO_3$ (strontium titanate), $ZrO_2$ (zirconia) or the like with which a crystalline structure of a metal compound can be provided in the non-active gas. The thickness thereof, although it is different depending on the usage, is normally 5–20 nm for a background for the growth of another semiconductor layer or crystalline dielectric layer, and it may be approx. 0.5–3 μm depending on the usage.

The insulative silicon oxide 2 may be a silicon oxide such as $SiO_2$, a silicon nitride such as $Si_3N_4$, silicon oxide nitride such as SiON. In the case of these compounds, with growth of the crystalline insulation layer 3, reaction occurs between the silicon in the substrate and the oxygen and/or nitrogen penetrating the crystalline insulation layer 3, and is limited to a compound of a material penetrating the crystalline insulation layer 3. During formation of the insulative silicon compound layer 2, element component constituting the crystalline insulation layer 3 is diffused and introduced. As readers the impurity element which is diffused and introduced, the inventors have revealed that insulation property and the etching property changes in accordance with the concentration of the impurity element. As will be described hereinafter which Table 3, when the impurity element concentration (not less than 0 at %) is not more than 10 at %, the insulation property is high; and when it is not more than 7 at %, particularly not more than 5 at %, the etching property is high. On the basis of these findings, the concentration of the component element of material which constitutes the crystalline insulation layer 3 and which is diffused and introduced into the insulative silicon compound layer 2 is controlled to be not more than 10 at %, preferably not more than 5 at %. The thickness of the insulative silicon compound layer 2 is determined in consideration of the insulation property, etching stop property, micro machining property or the like, depending on the usage. Normally, it is 10–60 nm.

According to the semiconductor device substrate of this embodiment, the monocrystal insulation layer 3 is provided on the silicon substrate 1 with the amorphous insulation film 2 therebetween, and therefore, the substrate has excellent electrical insulation property, etching stop property and micro machining property. In addition, the surface has a crystalline structure, and therefore, a semiconductor layer or a monocrystal dielectric layer can be formed on its surface through epitaxial growth. Since there is an amorphous insulation film 2 of silicon compound between the silicon crystal layer 1 and the monocrystal insulation layer 3, the insulation property is excellent, and therefore, the electrical insulation is very high between the layer formed on the surface of the crystalline insulation layer 3 and the silicon substrate 1 therebelow. The monocrystal insulation layer 3, as described herein before, is a metal compound, and therefore, ions are movable, and the insulation property is slightly poor, but the silicon oxide or silicon nitride (silicon compound) exhibits excellent electrical property. When the crystalline insulation layer is produced by reaction with metal using reactive gas, a large amount of impurity element is refused to the $SiO_2$ layer interface which is an insulative silicon compound layer, and therefore, sufficient insulation property or etching stop property is not provided. However, according to an embodiment of the present invention using a non-active gas such as Ar or the like, which will be described hereinafter, the impurity diffusion adjacent the interface can be suppressed to not more than 10 at %. By limiting the impurity element concentration (not less than 0 at %) to not more than 10 at %, the insulation property is excellent, and in addition by limiting it to not more than 7 at %, particularly, not more than 5 at %, the etching property is excellent.

As a result, as shown in FIG. 1, a SOI substrate 6 can be provided by forming a film of crystalline silicon 4 on the crystalline insulation layer 3 in the semiconductor device substrate 5, or a YSZ layer may be further formed on the SOI substrate to provide a substrate in which the crystal silicon layer is sandwiched by insulative oxide layers. In addition, on a silicon crystal layer having a semiconductor circuit pattern thereon, a semiconductor layer is further formed with an insulation layer therebetween to form a three dimensional circuit. A crystalline dielectric layer of ferroelectric material can be formed with a clean crystalline structure to provide a high performance semiconductor memory device. A Si monocrystal portion of the above-described sandwich structure may be used as a vibrational plate, an electrode and PZT or PMN is formed on the insulative crystal YSZ through the epitaxial growth, which can be used as a micro actuator.

Figure 2:
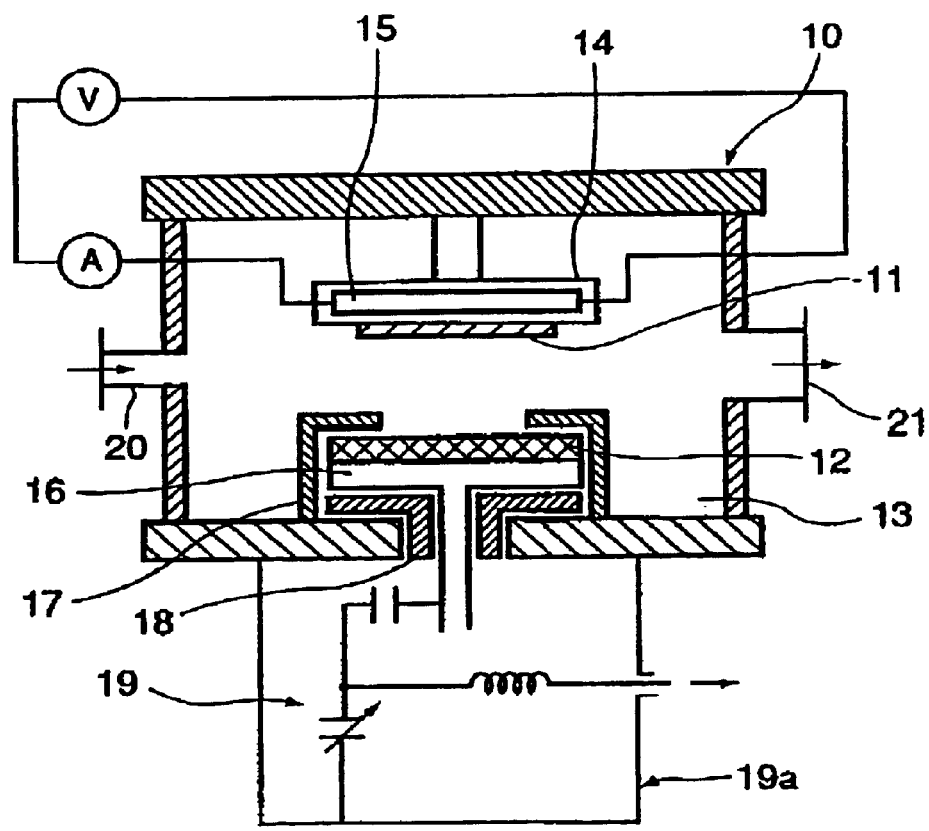
FIG. 2 is a schematic illustration of an example of a sputtering apparatus for epitaxial growth usable with a manufacturing method for the semiconductor device substrate according to the embodiment of the present invention.
Figure 3:
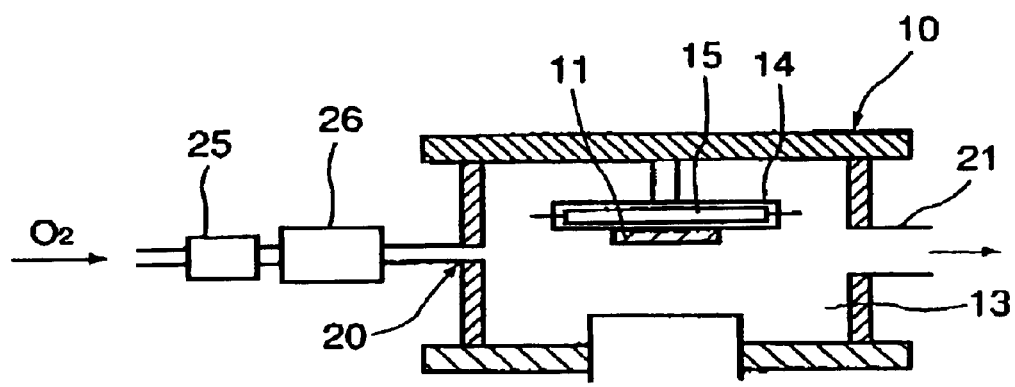
FIG. 3 is a schematic illustration of introduction, after completion of film formation by the sputtering apparatus of FIG. 2, of oxygen with the temperature during the film formation; in (a) dry $O_2$ is supplied; and in (b) water vapor $O_2$ is supplied.
Figure 3:
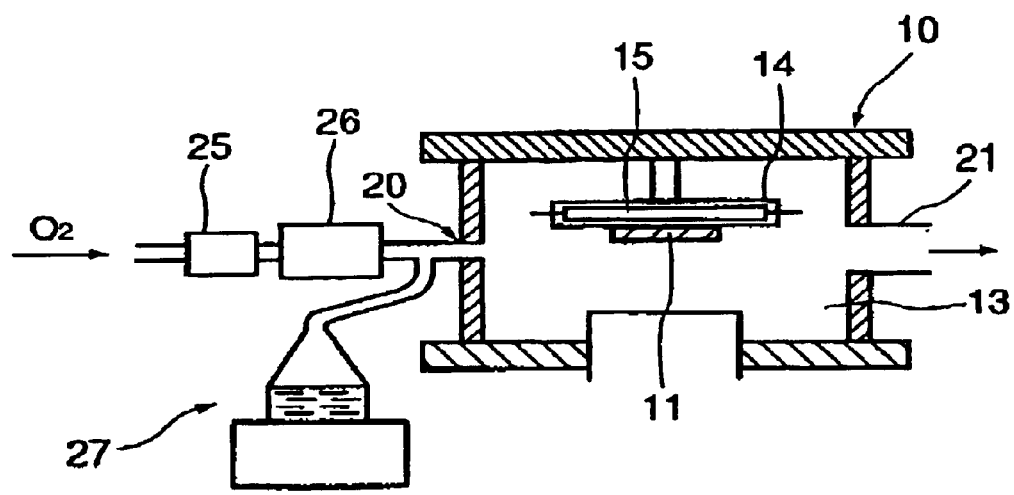
Figure 4:
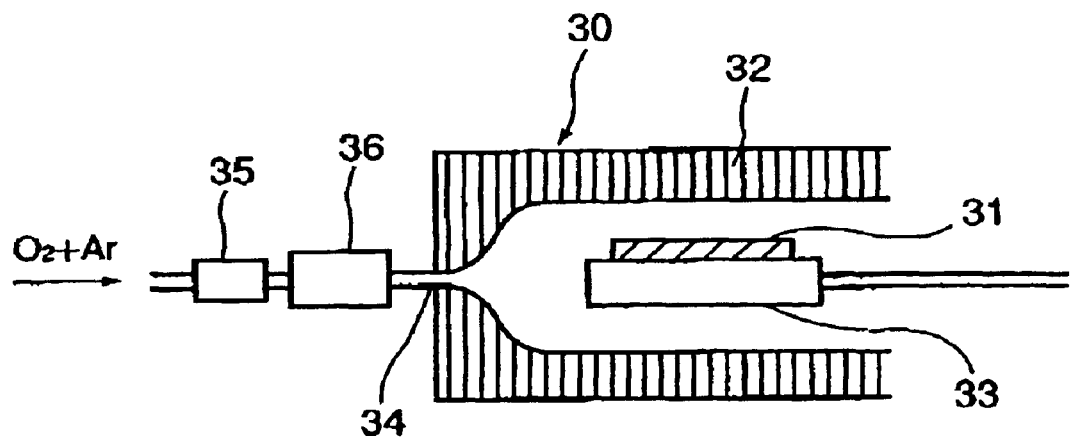
FIG. 4 is a schematic view illustrating an annealing process in the manufacturing method for the semiconductor device substrate according to the embodiment of the present invention; in (a) Ar+dry $O_2$ is supplied; in (b) Ar+water vapor $O_2$ is supplied.
Figure 4:
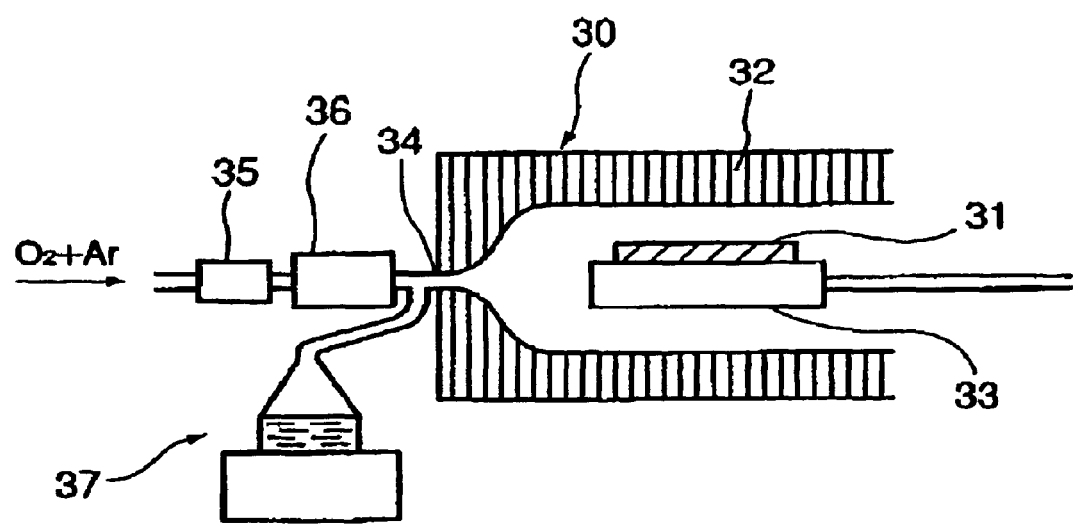

Referring to FIGS. 2 through 4, the description will be made as to a manufacturing method for a semiconductor device substrate according to an embodiment of the present invention, with which a crystal of crystalline insulation layer (YSZ) is grown on a silicon substrate with a silicon oxide film therebetween. FIG. 2 schematically shows an example of a sputtering apparatus for epitaxial growth, which is usable for manufacturing the substrate for the semiconductor device according to the embodiment of the present invention. FIG. 3 is a schematic illustration of introduction, after completion of film formation by the sputtering apparatus of FIG. 2, of oxygen with the temperature during the film formation; in (a) dry $O_2$ is supplied; and in (b) water vapor $O_2$ is supplied. FIG. 4 is a schematic view illustrating an annealing process in the manufacturing method for the semiconductor device substrate according to the embodiment of the present invention; in (a) Ar+dry $O_2$ is supplied; in (b) Ar+water vapor $O_2$ is supplied.

In the sputtering apparatus 10 shown in FIG. 2, the YSZ crystal is grown on the silicon substrate with the silicon oxide film therebetween. At this time, a substrate 11 of silicon semiconductor crystal layer having a diameter of 2 in. Is mounted on a substrate mount 14 in the vacuum chamber 13, and a target 12 is fixed on a target holding Table 16 so as to be opposed to the substrate mount 14. The target 12 used was $ZrO_2$ multiple oxide target comprising 5% of $Y_2O_3$. A frame 17 of permalloy encloses the target 12. The target supporting Table 16 is connected with a high oscillation voltage source through a matching circuit 19 to produce high frequency plasma discharge in the vacuum chamber 13. Designated by 19a is a matching box.

One side wall of the vacuum chamber 13 is provided with an introduction tube 20 for introduction of the gas, through which non-active gas (Ar) is supplied into the vacuum chamber 13. The other side wall of the vacuum chamber 13 is provided with a gas discharge opening 21. A heater 15 is used to control heating and cooling of the substrate 11. The substrate 11 heated by the heater 15 is located right above the target 12 with a gap of 3 cm. With the state, the sputtering film formation is carried out. As regards the temperature of the heater 15 hearing the film forming operation, the substrate temperature is not lower than 400° C., more particularly 600° C. or 800° C. for example.

Using such a sputtering apparatus 10, the non-active gas (Ar) is introduced into the vacuum chamber 13 through the introduction tube 20, the substrate is heated by the heater 15 to a temperature of not lower than 400° C., for example 600° C. or 800° C., and the high oscillation voltage source is actuated to cause Ar discharge. The YSZ film formation conditions are as follows:

Input power: 200W (fixed)

Ar gas flow rate: 20 sccm (fixed) and

Film formation time: 5 min.

With these conditions, metal (Zr, Y) is from the $ZrO_2$ multiple oxide target 12 comprising $Y_2O_3$ 5%, and a crystal layer of crystalline insulative material (YSZ) of metal oxide of them can be formed on the silicon substrate 11.

After the thin layer is formed of metal Zr by the sputtering apparatus, a similar film formation may be effected by an oxide target.

After the completion of the film formation, oxygen (dry $O_2$ or water vapor $O_2$)is introduced through the introduction tube 20 such that internal pressure of the vacuum chamber 13 becomes 1atm while maintaining the temperature during the film formation for a predetermined duration by the heater 15. After elapse of predetermined maintaining duration, the heater 15 is deactuated, quick cooling is carried out with Ar replacement to increase the oxide film layer ($SiO_2$) as the insulative silicon compound layer. This is shown in (a) and (b) of FIG. 3. In (a) of FIG. 3, the dry $O_2$ is supplied through a dryer 25 and a filter 26, and in (b) of FIG. 3, water vapor $O_2$ is provided by adding water vapor generated by heating water by water vapor to the $O_2$ supplied through the dryer 25 and the filter 26. Table 1 shows a relation between a thickness of the oxide film layer and a temperature holding time under the constant temperature heating condition (600° C. and 800° C. which is the film formation temperature) after the completion of the heating film formation. In the case that quick cooling was effected with the Ar replacement without keeping the temperature after the completion of the film formation, the increase of the oxide film layer ($SiO_2$) was not observed. From Table 1, it is understood that thickness of the oxide layer ($SiO_2$) increases when the holding time is long and the atmosphere is water vapor $O_2$.

TABLE 1

| holding time | 1 min. | 10 min. | 100 min. | 500 min. |
|---|---|---|---|---|
| | Thickness [nm] of oxide layer under 600° C. of film formation temperature | | | |
| dry $O_2$ | 1 | 5 | 12.5 | 50 |
| water vapor $O_2$ | 2.5 | 10 | 100 | 400 |
| | Thickness [nm] of oxide layer under 800° C. of film formation temperature | | | |
| dry $O_2$ | 2 | 10 | 25 | 100 |
| water vapor $O_2$ | 5 | 20 | 200 | 800 |

After the quick cooling of the silicon substrate together with Ar replacement, an annealing process is carried out using an electric furnace shown in FIG. 4. In FIG. 4, designated by 30 is an electric furnace including a heater 32 on its wall, and 33 is a substrate mount for mounting the substrate 31, which contains a heater therein. Designated by 34 is a gas introduction opening for permitting introduction of gas into the electric furnace 30. The gas introduction opening 34 is provided with a dryer 35 and a filter 36 ((a) of FIG. 4) which are connected in series. There is further provided water vapor generating means 37 for generating water vapor by heating pure water ((b) of FIG. 4).

Using such an apparatus, the annealing process is effected to the substrate for a predetermined time while keeping the temperature at not less than 600° C. (annealing temperature). In the annealing process, the temperature has been set at 600° C., 800° C. and 1000° C., and the investigations has been made as to the relation among the thickness of the oxide film layer, the annealing temperature and the process time under the atmosphere of dry $O_2$ and water vapor $O_2$. The results are shown in Table 2. As will be understood from Table 2, the oxide layer can be formed irrespective of the film thickness of the YSZ, and the annealing process can increase the oxide layer when the annealing temperature is high, and the atmosphere is the oxygen including the water vapor.

TABLE 2

| holding time | 1 min. | 10 min. | 100 min. | 500 min. |
|---|---|---|---|---|
| Thickness [nm] of oxide layer under 600° C. of annealing | | | | |
| dry $O_2$ | 1 | 5 | 12.5 | 50 |
| water vapor $O_2$ | 2.5 | 10 | 100 | 400 |
| Thickness [nm] of oxide layer under 800° C. of annealing | | | | |
| dry $O_2$ | 2 | 10 | 25 | 100 |
| water vapor $O_2$ | 5 | 20 | 200 | 800 |

TABLE 2-continued

| holding time | 1 min. | 10 min. | 100 min. | 500 min. |
|---|---|---|---|---|
| Thickness [nm] of oxide layer under 1000° C. of annealing | | | | |
| dry $O_2$ | 4 | 20 | 50 | 200 |
| water vapor $O_2$ | 10 | 40 | 400 | 1600 |

As described in the foregoing, the substrate is heated to not less than 400° C.; the metal oxide constituting the crystalline insulation layer is ejected in the non-active gas atmosphere (Ar or the like) from the target to grow the crystal layer of the crystalline insulative material on the silicon substrate; and then an amorphous insulative silicon compound layer ($SiO_2$ or the like, which will simply be called "oxide layer") is formed by oxygen diffusion which is considered as being at least one of (1) the oxygen diffusion from the oxide during the film formation, (2) oxygen diffusion during the temperature holding time after the completion of the film formation, and (3) oxygen diffusion due to the oxygen during the cooling; and the component element of the material constituting the crystalline insulative material is introduced into the insulative silicon compound layer by the diffusion. The distribution of the component element is such that it is large adjacent the interface between the crystalline insulative material layer and the insulative silicon compound layer, and gradually decreases away from the crystalline insulative material layer. Thus, the component element of the material constituting the crystalline insulative material is introduced and mixed into the insulative silicon compound layer, and the etching property and insulation property changes in accordance with the impurity concentration. As will be described hereinafter, sufficient insulation property and etching stop property are provided by limiting the impurity concentration to not more than 10 at %, preferably not more than 5 at %.

The investigations have been made as to changes of the etching property and electrical insulation property of a semiconductor device substrate with the impurity concentration in the insulative silicon compound layer ($SiO_2$) resulting from diffusion of Zr and Y which are elements constituting the crystalline insulation layer (YSZ). The results are shown in Table 3.

TABLE 3

Relation between Etching property and Electric insulation and Impurity concentration in $SiO_2$ Layer

| Zr, Y | 1 at % | 3 at % | 5 at % | 7 at % | 10 at % | 12 at % | 15 at % | 20 at % |
|---|---|---|---|---|---|---|---|---|
| Etch. | E | E | G | G | G | F | N | N |
| Insl. | E | E | E | E | G | F | N | N |

The etching property has been checked after placed in HF 1% solution (20° C.) for 10 min. or longer.
As regards etching:
E: not etched.
G: partly etched on the surface
F: partly solved
N: solved
The electric insulation property has been checked on the basis of breakdwon when 10 V is applied accross thickness 50 nm.
As regards insulation:
E: property was particularly good
G: property was good
F: breakdwon was partly observed
N: breakdown occurred As will be understood from Table 3, in the case of such a semiconductor device substrate, the Zr Y which are structure elements of the YSZ are diffused into the $SiO_2$ layer. The etching property and insulation property change with the concentration of the impurities (Zr+Y). If the concentration of the impurity (Zr+Y) is not more than 10 at %, the insulation property is excellent for use as an insulation film, and if the concentration is not more than 7 at %, particularly, not more than 5 at %, the etching property is also excellent. In consideration of the results, according to the present invention, the component element of the material constituting the crystalline insulation layer 3 diffusing into the insulative silicon compound layer 2 is made of more than 10 at %, preferably not more than 5 at %.

The comparison with respect to the etching property and the electrical insulation property has been made between the oxide layer (insulative silicon compound layer) formed between the YSZ and the silicon substrate with introduction of non-active gas such as Ar or the like and the oxide layer (comparison example) formed between the YSZ and the silicon substrate with introduction of oxygen causing reaction with the metal. The results are shown in Tables 4 and 5.

TABLE 4

| | Etching property HF 1% solution (20° C.) | | |
|---|---|---|---|
| time | 1 min. | 5 min. | 10 min. |
| Present invention | | | |
| $SiO_2$ (100 nm) Reactive sputtering | E | E | E |
| $SIO_2$ (100 nm) | G | F | N |

The etching property has been checked after placed in HF 1% solution (20° C.).
As regards etching:
E: not etched.
G: partly etched on the surface
F: partly solved
N: solved

TABLE 5

| | Electric Insulation (1–20 V) | | | | |
|---|---|---|---|---|---|
| Volt | 1 V | 5 V | 10 V | 15 V | 20 V |
| Present invention | | | | | |
| $SiO_2$ (100 nm) Reactive sputtering | E | E | E | G | G |
| $SIO_2$ (100 nm) | F | FN | N | N | N |

The electric insulation property has been checked on the basis of breakdwon when 20 V is applied accross thickness 100 nm.
As regards insulation:
E: property was particularly good
G: property was good
F: breakdwon was partly observed
N: breakdown occurred As will be understood from Tables 4 and 5, the oxide layer provided by the sputtering in the non-active gas atmosphere according to the present invention exhibits good etching property and electrical insulation property. On the contrary, the oxide layer provided by a reactiv sputtering exhibits poor insulation property and etching stop function, and it is not suitable for a semiconductor substrate or a substrate for micro machining. In the foregoing Embodiments, the substrate temperature is 600° C. or 800° C. However, it has been confirmed that same advantageous effects are provided when it is 400° C. In the foregoing embodiments, the crystal layer of YSZ is grown using a multiple oxide target comprising $Y_2O_3$ and $ZrO_2$, but it is possible to grow the crystal layer using a $SrTiO_3$ as the target. By using $Al_2O_3$ for the target, the crystal layer of $Al_2O_3$ can be similarly grown, and similarly, a crystal layer of MgO or $ZrO_2$ can be grown.

While the invention has been described with reference to the structures disclosed herein, it is not confined to the details set forth and this application is intended to cover such modifications or changes as may come within the purpose of the improvements or the scope of the following claims.

What is claimed is:

1. A manufacturing method for a semiconductor device substrate, comprising the steps of:

ejecting, in non-active gas, a metal oxide constituting a crystaline insulation layer;

forming a crystal layer of a crystalline insulative material on a silicon substrate heated up to not lower than 400° C.; and forming an insulative silicon compound layer on the silicon substrate by oxygen diffusion from an oxide during said forming step, oxygen diffusion during a temperature holding time after said forming step and/or oxygen diffusion during a cooling operation.

2. A method according to claim 1, wherein the silicon substrate and the target are disposed opposed to each other in a sputtering apparatus, and discharge of the non-active gas supplied into the sputtering apparatus is produced to grow the crystal layer of the crystalline insulative material.

3. A method according to claim 1, wherein the target comprises $ZrO_2$ and $Y_2O_3$ which are mixed or which are solved, the non-active gas is argon, the crystalline insulation layer is YSZ, the insulative silicon compound is silicon oxide and a component constituting the crystalline insulation layer, which are contained in insulative silicon compound by diffusion, is Zr and/or Y.

4. A method for manufacturing SOI substrate comprising a method as defined in claim 1, wherein crystalline silicon film is formed on the crystalline insulation layer which is formed on the silicon substrate.

* * * * *

UNITED STATES PATENT AND TRADEMARK OFFICE
CERTIFICATE OF CORRECTION

PATENT NO. : 6,841,490 B2
DATED : January 11, 2005
INVENTOR(S) : Akira Unno et al.

It is certified that error appears in the above-identified patent and that said Letters Patent is hereby corrected as shown below:

Column 2,
Line 5, "layer" should read -- layers --.
Line 44, "not" should be deleted.

Column 4,
Line 35, "changes" should read -- change --.
Line 37, "which" should read -- with reference to --.

Column 5,
Line 31, "as to" should read -- of --.
Line 51, "Is" should read -- is --.

Column 6,
Line 3, "hearing" should read -- heating --.
Line 30, "latm" should read -- 1 atm --.
Line 43, "is the film formation temperature)" should read -- are the film formation temperatures) --.

Column 7,
Line 16, "has" should read -- have --.

Column 8,
Line 31, "changes" should read -- change --.
Table 3, "breakdwon" (both occurrences) should read -- breakdown --, and "accross" should read -- across --.

Column 9,
Line 2, "Zr" should read -- Zr and--.
Table 5, "won" should read -- own --, "accross" should read -- across --, and "breakdwon" should read -- breakdown --.

UNITED STATES PATENT AND TRADEMARK OFFICE
CERTIFICATE OF CORRECTION

PATENT NO. : 6,841,490 B2
DATED : January 11, 2005
INVENTOR(S) : Akira Unno et al.

It is certified that error appears in the above-identified patent and that said Letters Patent is hereby corrected as shown below:

Column 10,
Line 5, "reactiv" should read -- reactive --.

Signed and Sealed this

Fourth Day of October, 2005

JON W. DUDAS
*Director of the United States Patent and Trademark Office*